United States Patent [19]
Bosshart

[11] Patent Number: 6,049,231
[45] Date of Patent: Apr. 11, 2000

[54] DYNAMIC MULTIPLEXER CIRCUITS, SYSTEMS, AND METHODS HAVING THREE SIGNAL INVERSIONS FROM INPUT TO OUTPUT

[75] Inventor: Patrick W. Bosshart, Plano, Tex.

[73] Assignee: Texas Instruments Incorporated, Dallas, Tex.

[21] Appl. No.: 09/118,471

[22] Filed: Jul. 17, 1998

Related U.S. Application Data

[60] Provisional application No. 60/053,270, Jul. 21, 1997.

[51] Int. Cl.[7] .................... H03K 19/096; H03K 19/094; H03K 19/01
[52] U.S. Cl. ................................ 326/98; 326/95; 326/17; 326/112
[58] Field of Search .................................. 326/93, 95, 98, 326/112, 119, 121, 17

[56] References Cited

U.S. PATENT DOCUMENTS

| | | | |
|---|---|---|---|
| 5,117,133 | 5/1992 | Luebs | 326/55 |
| 5,258,666 | 11/1993 | Furuki | 326/106 |
| 5,389,835 | 2/1995 | Yetter | 326/98 |
| 5,440,243 | 8/1995 | Lyon | 326/33 |
| 5,459,693 | 10/1995 | Komarek et al. | 365/207 |
| 5,483,181 | 1/1996 | D'Souza | 326/98 |
| 5,530,659 | 6/1996 | Anderson et al. | 708/205 |
| 5,541,537 | 7/1996 | Kim et al. | 326/121 |
| 5,541,885 | 7/1996 | Takashima | 365/226 |
| 5,572,151 | 11/1996 | Hanawa et al. | 326/113 |
| 5,594,371 | 1/1997 | Douseki | 326/119 |
| 5,602,497 | 2/1997 | Thomas | 326/93 |
| 5,661,675 | 8/1997 | Chin e al. | 708/670 |
| 5,815,005 | 9/1998 | Bosshart | 326/95 |
| 5,821,775 | 10/1998 | Mehta et al. | 326/98 |
| 5,821,778 | 10/1998 | Bosshart | 326/95 |
| 5,831,451 | 11/1998 | Bosshart | 326/95 |

*Primary Examiner*—Michael Tokar
*Assistant Examiner*—James H Cho
*Attorney, Agent, or Firm*—Rebecca Mapstone Lake; Fred Telecky

[57] ABSTRACT

A dynamic multiplexer circuit (20) comprising an integer number N of data providing circuits (26, 28, 30), wherein the integer number N is greater than one. Each of the plurality of data providing circuits comprises a precharge node ($26_{PN}$, $28_{PN}$, $30_{PN}$) to be precharged to a precharge voltage during a precharge phase, and a conditional series discharge path ($26_L$ and $26_{DT}$, $28_L$ and $28_{DT}$, $30_L$ and $30_{DT}$) connected to the precharge node Each discharge path is operable in response to at least one enabling input signal ($INPUTS_{26}$, $INPUTS_{28}$, $INPUTS_{30}$) to discharge the precharge voltage at the precharge node during an evaluate phase thereby providing a first monotonic transitioning data signal at the precharge node. Each of the plurality of data providing circuits further comprises an inverter ($26_{INV}$, $28_{INV}$, $30_{INV}$) coupled to the precharge node and having an output for providing a second monotonic transitioning data signal. The second monotonic transitioning data signal is complementary of the first monotonic transitioning data signal. The dynamic multiplexer further comprises the integer number N of data select paths. Each of the data select paths comprises a select transistor T1, T2, T3), the transistor having a source coupled to receive the second monotonic transitioning data signal and a gate connected to receive a select signal (SEL1, SEL2, SEL3). A drain of the select transistor in each of the data select paths is coupled to conditionally discharge an output precharge node ($DSEL_{PN}$). Lastly, the dynamic multiplexer includes an output inverter ($INV_{DOUT}$) having an input connected to the output precharge node. In a given evaluate phase of operation, in response to assertion of a select signal corresponding to one of the data select paths, the transistor receiving the asserted select signal at its gate and the second monotonic transitioning data signal at its source conducts for providing an output data signal at an output of the output inverter, wherein the output data signal represents three signal inversions of the at least one enabling input signal.

25 Claims, 5 Drawing Sheets

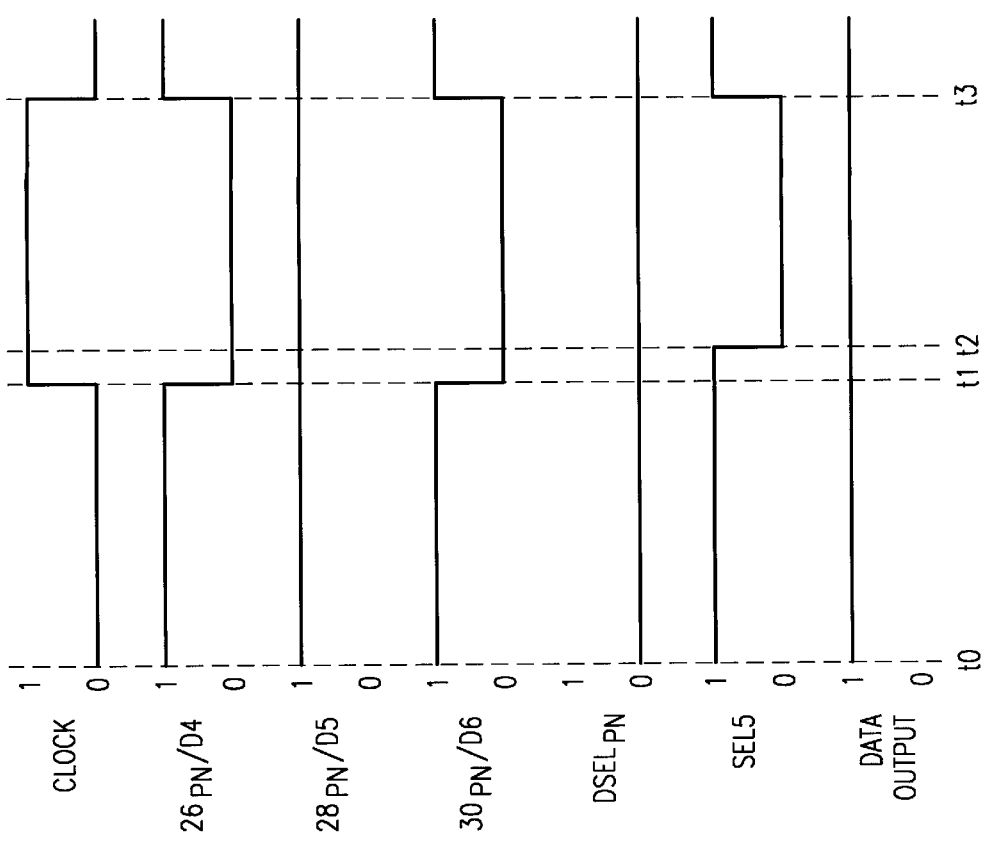
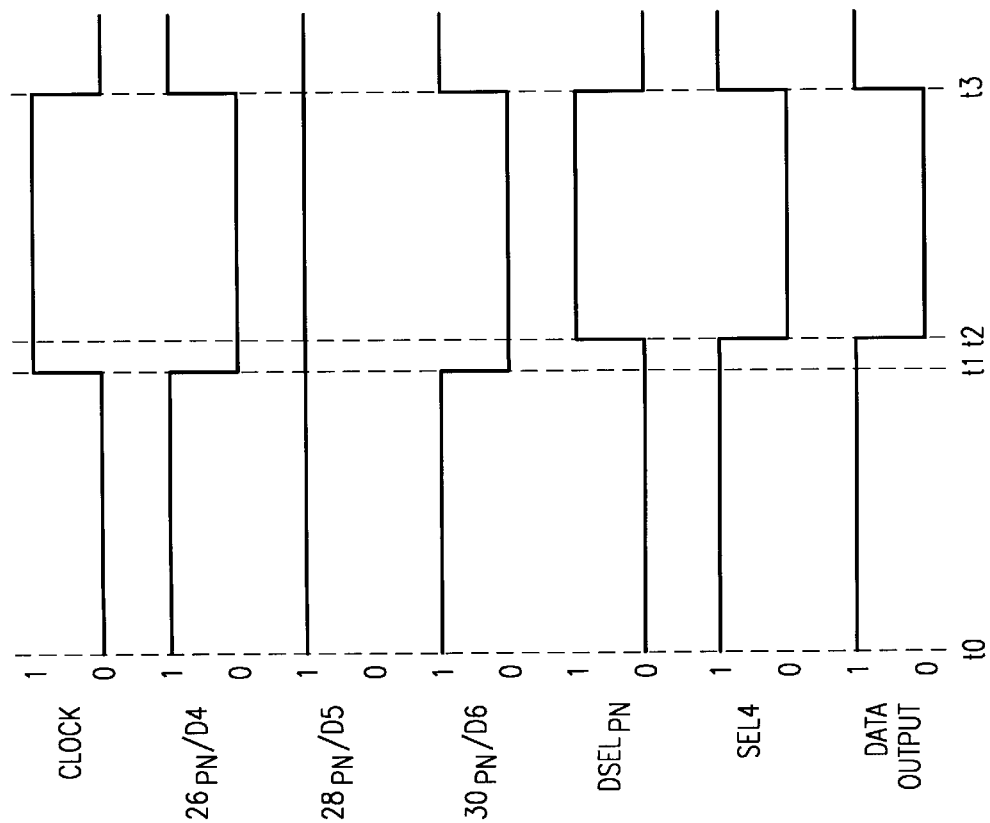

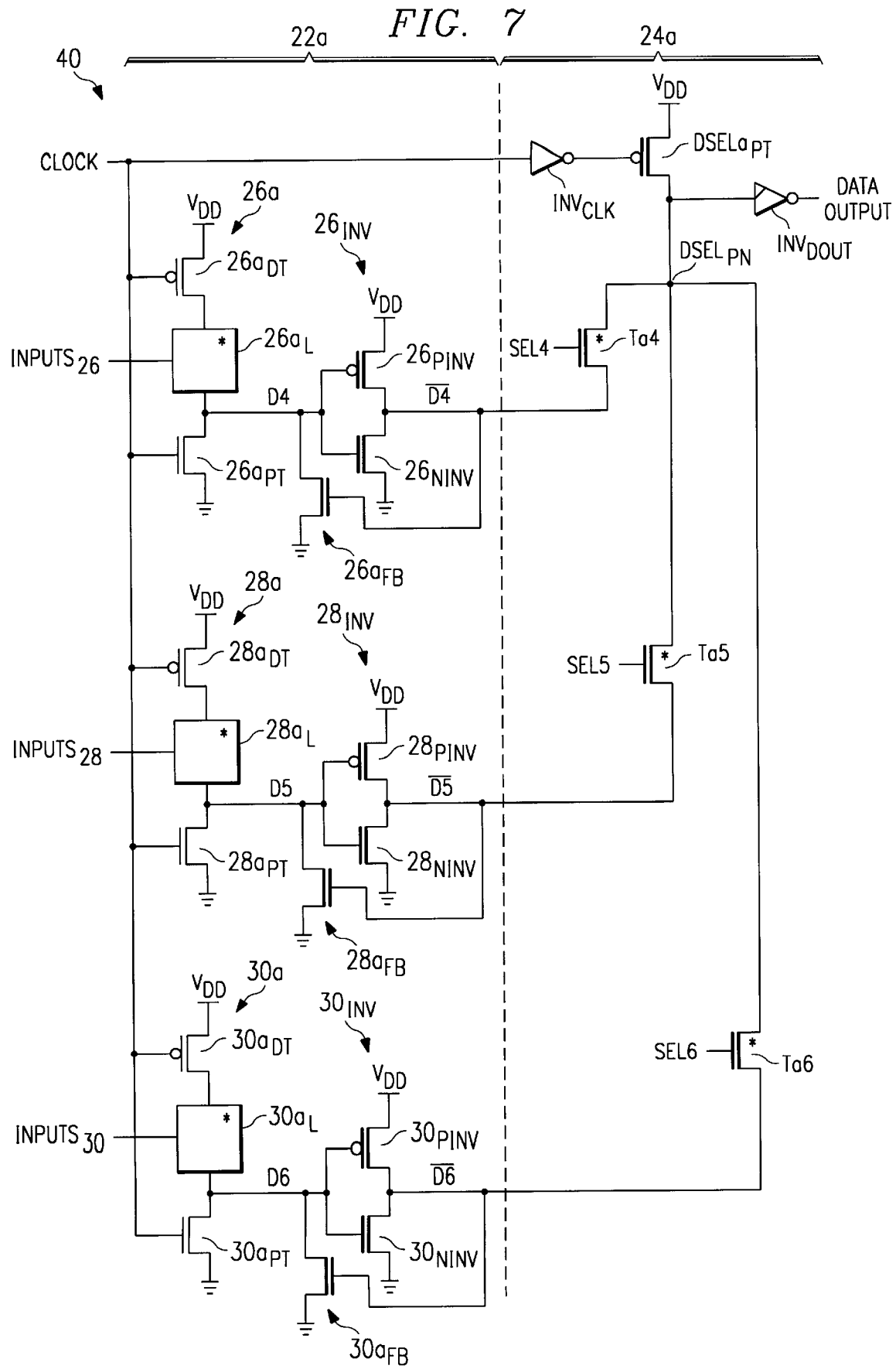

DYNAMIC MULTIPLEXER CIRCUITS, SYSTEMS, AND METHODS HAVING THREE SIGNAL INVERSIONS FROM INPUT TO OUTPUT

This application claims priority under 35 USC 119(e)(1) of provisional application Ser. No. 60/053,270, filed Jul. 21, 1997.

BACKGROUND OF THE INVENTION

The present embodiments relate to domino logic technology, and are more particularly directed to dynamic multiplexer circuits, systems, and methods having three signal inversions from input to output.

In many modern circuit applications, it is often desirable to increase the speed of operation of the circuit application. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time.

To increase the speed of microprocessors, as well as other circuits where speed is important, dynamic or so-called "domino" logic transistor circuits are currently used because they often provide increased speed as compared to static logic transistor circuits. A domino logic circuit is characterized by operating in two phases. First, a precharge node is set to a first potential during a precharge phase. Second, during an evaluate phase, if the logic condition represented by the circuit is satisfied, the precharge node is discharged, thereby changing the logic output of the circuit. In other words, at the conclusion of the precharge phase, the precharge node causes a first logic state to be output by the domino logic circuit. Thereafter, if the precharge node is discharged during the evaluate phase, the output of the domino logic circuit represents a second logic state differing from the first logic state. Moreover, the act of discharging to change states, when accomplished using one or more n-channel transistors to gate the transition from precharge to discharge, represents a speed increase over the prior operation of static circuits which in one instance accomplished a transition with a network of n-channel transistors while in another instance accomplished the opposite transition with a network of p-channel transistors.

One specific example of domino logic transistor circuits is known in the prior art as a dynamic multiplexer. In some contexts, the dynamic multiplexer is sometimes also referred to as a cascode multiplexer or cascode multiplexer logic. In any event, as presented in detail below, operation of the dynamic multiplexer generally follows the principles set forth above as characteristic of domino logic circuits. Additionally the dynamic multiplexer performs a multiplexer function in that any one of multiple data inputs may be selected by asserting a select signal to an input corresponding to the data input. More specifically, the dynamic multiplexer connects each data input to a source of a respective transistor, and a given data input is selected by asserting a signal to the gate of one of the respective transistors. While this implementation provides the functionality set forth above, it is shown below that it includes various drawbacks. For example, as a data transition is connected to a domino logic input, and then selected to an output of the dynamic multiplexer, it incurs a total of four inversions along its path. These four inversions necessarily introduce several drawbacks. For example, naturally there are hardware requirements to construct the inverting circuitry. As another example, each inversion introduces delay to the circuit. As yet another example, there is a financial cost in building each inverter as well as the space required to form the inverter on the semiconductor device used to form the dynamic multiplexer. The inventor of the present embodiments has recognized these above considerations aid below sets forth various embodiments which reduce the above-described drawbacks and improve performance as compared to the prior art.

BRIEF SUMMARY OF THE INVENTION

In the preferred embodiment, there is a dynamic multiplexer circuit comprising an integer number N of data providing circuits, wherein the integer number N is greater than one. Each of the plurality of data providing circuits comprises a precharge node to be precharged to a precharge voltage during a precharge phase, and a conditional series discharge path connected to the precharge node. Each discharge path is operable in response to at least one enabling input signal to discharge the precharge voltage at the precharge node during an evaluate phase thereby providing a first monotonic transitioning data signal at the precharge node. Each of the plurality of data providing circuits further comprises an inverter coupled to the precharge node and having an output for providing a second monotonic transitioning data signal. The second monotonic transitioning data signal is complementary of the first monotonic transitioning data signal. The dynamic multiplexer further comprises the integer nunber N of data select paths. Each of the data select paths comprises a select transistor, the transistor having a source coupled to receive the second monotonic transitioning data signal and a gate connected to receive a select signal. A drain of the select transistor in each of the data select paths is coupled to conditionally discharge an output precharge node. Lastly, the dynamic multiplexer includes an output inverter having an input connected to the output precharge node. In a given evaluate phase of operation, in response to assertion of a select signal corresponding to one of the data select paths, the transistor receiving the asserted select signal at its gate and the second monotonic transitioning data signal at its source conducts for providing an output data signal at an output of the output inverter, wherein the output data signal represents three signal inversions of the at least one enabling input signal. Other circuits, systems, and methods are also disclosed and claimed.

BRIEF DESCRIPTION OF THE SEVERAL VIEWS OF THE DRAWING

FIG. 5 illustrates a timing diagram of the operation of the inventive dynamic multiplexer of FIG. 4, and more particularly illustrates the output of a signal corresponding to an asserted input signal;

FIG. 6 illustrates a timing diagram of the operation of the inventive dynamic multiplexer of FIG. 4, and more particularly illustrates the output of a signal corresponding to a de-asserted input signal; and FIG. 7 illustrates a schematic of an alternative dynamic multiplexer in accordance with the present embodiments, where the alternative implements various transistors of complementary conductivity type in comparison to the embodiment of FIG. 4.

DETAILED DESCRIPTION OF THE INVENTION

Figure 1:
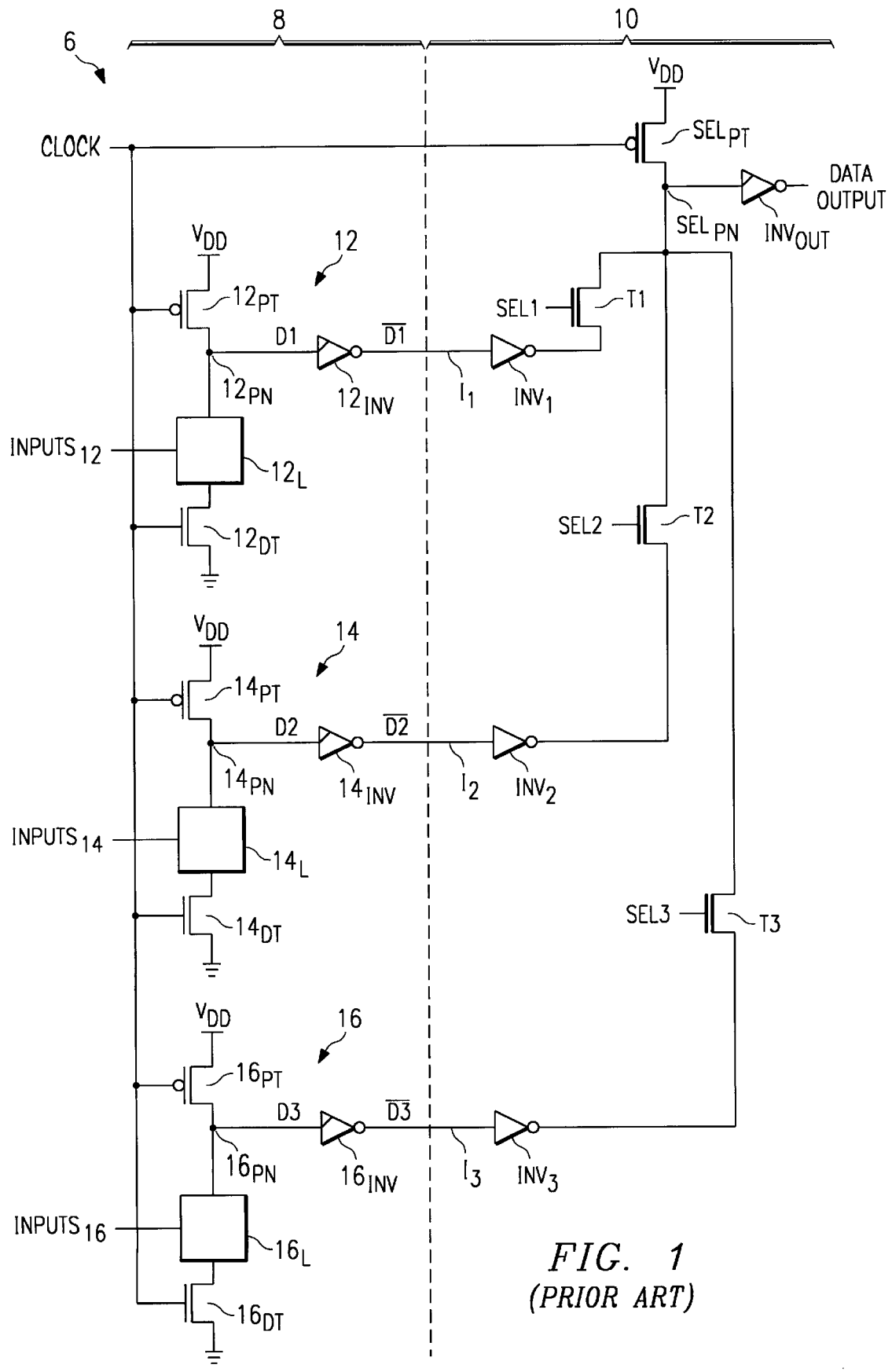
FIG. 1 illustrates a schematic of a prior art dynamic multiplexer.

FIG. 1 illustrates a schematic of a prior art dynamic multiplexer designated generally at 6. Dynamic multiplexer 6 includes data providing circuitry 8 for providing data signals as well as data selection circuitry 10 for then selecting one of the data signals to be presented at an output. As a matter of introduction and for purposes of later discussion, a vertical dashed line generally separates data generating circuitry 8 from data selection circuitry 10 with the former to the left of the dashed line and the latter to the right of the line. Each of these circuits is discussed below.

Looking to data generating circuitry 8 as shown to the left of the vertical dashed line in FIG. 1, this includes three separate dynamic logic circuits shown generally at 12, 14, and 16. Data generating circuitry 8 generally may include any integer number of dynamic logic circuits and, therefore, three circuits 12, 14, and 16, are shown in FIG. 1 merely by way of example. Each of circuits 12, 14, and 16 shares various common attributes, as will be appreciated by one skilled in the art from the following discussion directed to circuit 12. Circuit 12 is a known domino logic circuit stage, which includes a precharge transistor $12_{PT}$, a precharge node $12_{PN}$, an output inverter $12_{INV}$, and a discharge path including both a logic circuit $21_L$ and a discharge transistor $12_{DT}$. Additionally, dynamic multiplexer 6 includes a conductor for providing a CLOCK signal, and the CLOCK signal is connected to the gate of precharge transistor $12_{PT}$ and to the gate of discharge transistor $12_{DT}$.

Looking more specifically to the connections of circuit 12, precharge transistor $12_{PT}$ is a p-channel transistor which is typically smaller than the n-channel transistors shown in FIG. 1. Precharge transistor $12_{PT}$ has a source connected to a source of the system voltage level (e.g., $V_{DD}$) and a drain connected to precharge) node $12_{PN}$. As noted above, the CLOCK signal is connected to the gate of precharge transistor $12_{PT}$ and is also connected to the gate of discharge transistor $12_{PT}$. Discharge transistor $12_{DT}$ is an n-channel having its source connected to a low reference voltage (e.g., ground) and its drain connected to a node $12_N$. Between precharge node $12_{PN}$ and node $12_N$ is connected logic circuit $12_L$. The particular logic of logic circuit $12_L$ may implement any type of logic equation. For example, often logic circuit $12_L$ will include numerous transistors connected in various fashions to implement such a logic equation, and the logic function is determined based on the particular transistor configuration as well as the respective input signals connected to the gates of those transistors. For purposes of the present discussion, the particular logic equation and inputs are not important and, thus, the legend INPUTS$_{12}$ is generally shown with it understood that such signals may come from any of various other circuits, being static, dynamic, or both. What is noteworthy, however, is that once the logic equation formed by logic circuit $12_L$ is true, at least one conductive path is formed through logic circuit $12_L$, thereby connecting precharge node $12_{PN}$ node $12_N$ (i.e., to the drain of discharge transistor $12_{DT}$). Further, recall that the CLOCK signal is connected to the gate of discharge transistor $12_{DT}$. Thus, when the CLOCK is high then the discharge transistor $12_{DT}$ is also conducting; if this conduction occurs while the logic equation implemented by logic circuit $12_L$ is true, then the conducting series path along the source/drains of the transistors forms a discharge path from precharge node $12_{PN}$ to ground such that the precharge voltage (i.e., $V_{DD}$) at precharge node $12_{PN}$ is permitted to discharge to ground.

Returning to precharge node $12_{PN}$, it is further connected to the input of output inverter $12_{INV}$. The output of output inverter $12_{INV}$ provides an output signal for circuit 12 (i.e., the result of the logic equation of logic circuit $12_L$). Note that output inverter $12_{INV}$ is shown as having a short diagonal line in the upper half of the inverter symbol. For purposes of this document, the upper diagonal line of this symbol is included as a convention to demonstrate that a p-channel transistor (not expressly illustrated) is connected in a feedback manner from the output of the inverter to its input. With respect to the p-channel feedback transistor, its gate is connected to the output of the corresponding inverter, the source of the feedback panel transistor is connected to $V_{DD}$, and the drain of the feedback p-channel transistor is connected to the input of the corresponding inverter. One skilled in the art will there fore appreciate that once the precharge voltage is no longer connected to a given precharge node in FIG. 1 (e.g., during the evaluate phase described below), the feedback p-channel transistor will maintain a high signal at the input of the inverter so long as the precharge node is not discharged by its corresponding discharge path.

With respect to circuits 14 and 16, note that their circuit elements are generally connected in the same manner as circuit 12 detailed above, with the exception of the inputs to, and transistors within, logic circuit $14_L$ and $16_L$, as well as the output of inverters $14_{INV}$ and $16_{INV}$ as detailed later. Thus, these inputs and outputs are discussed below while the remainder of the circuit details are not re-stated here and the reader is referred to the above discussion of circuit 12 for comparable details.

Figure 2:
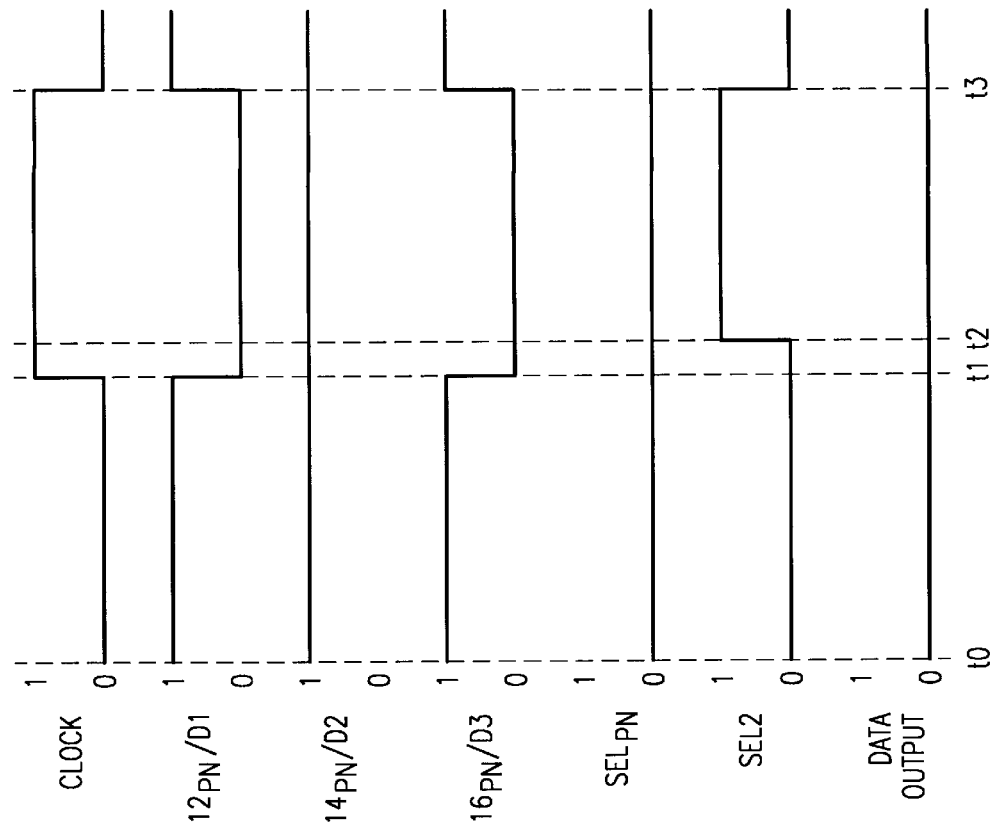
FIG. 2 illustrates a timing diagram of the operation of the dynamic multiplexer of FIG. 1, and more particularly illustrates the output of a signal corresponding to an asserted input signal.
Figure 3:
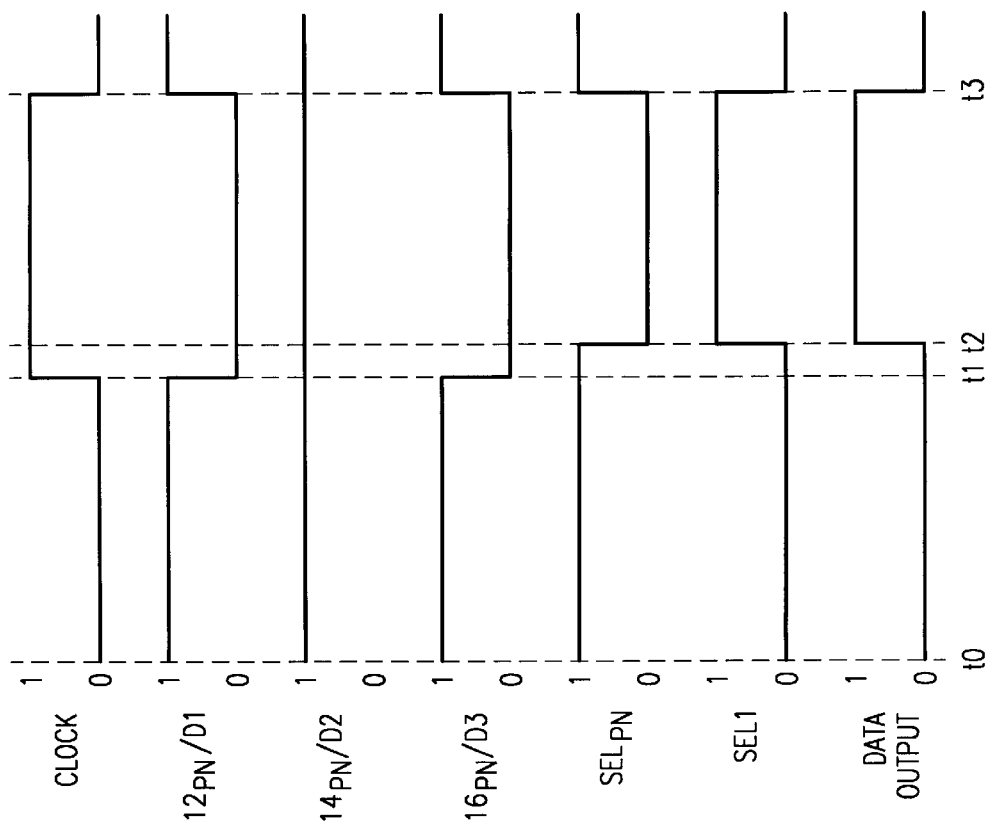
FIG. 3 illustrates a timing diagram of the operation of the dynamic multiplexer of FIG. 1, and more particularly illustrates the output of a signal corresponding to a de-asserted input signal.

Having discussed the connections to circuits 12, 14, and 16, later in FIGS. 2 and 3 are presented timing diagrams demonstrating their detailed operation; as an overview, however, note at this point the two phases of operation of those circuits, as is common for dynamic logic. The first phase of operation is referred to as the precharge phase of operation; in the embodiment of FIG. 1, this precharge phase occurs when the CLOCK signal is low. More particularly, note that the low CLOCK signal is enabling to each of precharge transistors $12_{PT}$, $14_{PT}$, and $16_{PT}$. Note that the statement that a signal is "enabling", such a the CLOCK signal in the current example, is a term known in the art and indicates that the gate-to-source potential is sufficient to cause conduction along the conductive path (i.e., the source/drain) of the transistor to which the gate potential is connected. Conversely, if the signal is "disabling", then the gate-to-source potential is insufficient to cause conduction along the source/drain of the transistor to which the gate potential is connected. These terms are used in various locations through the remainder of this document. Returning to the effect of the enabling low (CLOCK signal, the conduction of each of precharge transistors $12_{PT}$, $14_{PT}$, and $16_{PT}$ couples $V_{DD}$ to each of precharge nodes $12_{PN}$, $14_{PN}$, and $16_{PN}$, respectively, thereby precharging those nodes to a voltage of $V_{DD}$. Next, the second phase of operation occurs, which is known as the evaluate phase of operation. During the evaluate phase, input signals are provided to INPUTS$_{12}$, INPUTS$_{14}$, and INPUTS$_{16}$, and the CLOCK signal transitions from low to high such that each of the discharge transistors 12$_{DT}$, 14$_{DT}$, and 16$_{DT}$ are enabled and each of the precharge transistors 12$_{PT}$, 14$_{PT}$, and 16$_{PT}$ are disabled. Thus, if any of logic circuits 12$_L$, 14$_L$, and 16$_L$ are realized as true based on their corresponding INPUTS and internal transistor configurations, then the respective precharge node is discharged. For example, looking to circuit 12, if logic circuit 12$_L$ realizes its logic function as true, then a conductive path is formed from precharge node 12$_{PN}$ to the drain of discharge transistor 12$_{DT}$. Moreover, because discharge transistor 12$_{DT}$ is concurrently conducting due to the high CLOCK signal, then a complete discharge path is formed which includes both the conductive path through logic circuit 12$_L$ and the source/drain of discharge transistor 12$_{DT}$. Consequently, this discharge path discharges the precharged voltage of V$_{DD}$ at precharge node 12$_{PN}$ to ground. In response, the output from inverter 12$_{INV}$ changes state, that is it transitions from low (as it was after the precharge voltage of V$_{DD}$ was connected to 12$_{PN}$) to high. Thus, the precharge voltage at precharge node 12$_{PN}$ may be thought of as data to be presented during the evaluate phase and, therefore, is indicated as D1 in FIG. 1; specifically, during the evaluate phase of operation, this voltage is conditionally discharged, meaning it either remains at a constant state if a discharge path is not enabled during the that phase, or changes state should such a discharge path be enabled by a true logic finding in logic circuit 12$_L$.

From the above, one skilled in the art will appreciate that the three dynamic logic circuits of data providing circuitry 8 to the left of the vertical dashed line in FIG. 1 present a total of three data signals D1, D2 and D3, and each of these passes through a respective inverter to provide complementary signals $\overline{D1}$, $\overline{D2}$ and $\overline{D3}$, to data selection circuitry 10 to the right of the vertical dashed line in FIG. 1. Turning then to data selection circuitry 10, it includes data inputs I$_1$, I$_2$, and I$_3$ for receiving each of the complementary data signals $\overline{D1}$, $\overline{D2}$ and $\overline{D3}$, respectively. Each data input I$_1$, I$_2$, and I$_3$ is connected to an input of an inverter INV$_1$, INV$_2$, and INV$_3$, respectively. The outputs of inverters INV$_1$, INV$_2$, and INV$_3$ are connected to the source of n-channel transistors T1, T2 and T3, respectively. The gates of n-channel transistors T1, T2 and T3 are connected to corresponding select signals, designated SEL1, SEL2, and SEL3, respectively. Lastly with respect to transistors T1, T2 and T3, their drains are all connected to a single precharge node SEL$_{PN}$. Precharge node SEL$_{PN}$ is connected to the drain of a p-channel precharge transistor SEL$_{PT}$, which has its gate connected to the CLOCK signal and its source connected to V$_{DD}$. Precharge node SEL$_{PN}$ is also connected to the input of an inverter INV$_{OUT}$, which provides the DATA OUTPUT for dynamic multiplexer 6. Lastly, note that inverter INV$_{OUT}$, in a manner discussed above, has a short diagonal line in the upper half of the inverter symbol; again, this indicates that INV$_{OUT}$ has a p-channel transistor (not expressly illustrated) connected in a feedback manner from the output of the inverter to its input.

FIG. 2 illustrates a timing diagram of the operation of dynamic multiplexer 6 of FIG. 1, with a particular example where D1 is selected as the data for the DATA OUTPUT. Before proceeding, note for purposes of simplification that various delays are not shown in FIG. 2 when in actuality the transitions shown are not instantaneous. Additionally, certain transitions in FIG. 2 are triggered by other transitions rather than occurring at the immediate same time as shown. With respect to these triggered transitions, the causation is clear from the following discussion and the short delay in those instances need not be shown nor described for purposes of understanding the general operation of dynamic multiplexer 6. Looking then to FIG. 2 and starting at its top, the first signal is the CLOCK signal as connected to various precharge and discharge transistors in dynamic multiplexer 6. Following the CLOCK, signal, the next three signals illustrate the voltage levels at precharge nodes 12$_{PN}$, 14$_{PN}$, and 16$_{PN}$, respectively. Again, because the voltage on these nodes is defined earlier as representing data to be provided during the evaluate phase, then these signals are labeled with both the identifier of the precharge node and the corresponding data signal (e.g., 12$_{PN}$/D1 indicates the voltage on precharge node 12$_{PN}$, which corresponds to the data signal D1). The fifth signal in FIG. 2 shows the voltage at precharge node SEL$_{PN}$ of data selection circuitry 10. The sixth signal in FIG. 2 shows the assertion a select signal to choose D1 since that is the example assumed to occur for FIG. 2; thus, this sixth signal shows the value of SEL1 which, as appreciated from the connections of FIG. 1 and the following discussion, is the select signal which is asserted to cause the value of D1 to be connected to the DATA OUTPUT. The seventh and final signal of FIG. 2 shows the value of the DATA OUTPUT.

At t0, the CLOCK signal is low. Therefore, the four precharge transistors in FIG. 1, namely, 12$_{PT}$, 14$_{PT}$, 16$_{PT}$, and SEL$_{PT}$, are enabled. The conduction of these transistors causes each of the corresponding precharge nodes 12$_{PN}$, 14$_{PN}$, 16$_{PN}$, and SEL$_{PN}$, to charge to a high voltage (i.e., to V$_{DD}$). By definition, data selection circuitry 10 is not to be enabled to make any selection during the precharge phase of operation. Therefore, at t0 (i.e., during precharge), all select signals are not enabling. Because FIG. 2 pertains only to the selection of D1, only SEL1 is shown; moreover, since the selection signals are non-enabling during precharge, then at to SELL1 is shown low which is non enabling to T2.

At t1, the CLOCK signal transitions from low to high. Therefore, the three precharge transistors of data providing circuitry 8, namely, 12$_{PT}$, 14$_{PT}$, and 16$_{PT}$ are disabled as is precharge transistor SEL$_{PT}$ of data selection circuitry 10. In addition, the high CLOCK signal enables each of the discharge transistors of data providing circuitry 8, namely, 12$_{DT}$, 14$_{DT}$, and 16$_{DT}$, and also at this time the inputs signals INPUTS$_{12}$, INPUTS$_{14}$, and INPUTS$_{16}$ are asserted to each of logic circuits 12$_L$, 14$_L$, and 16$_L$, respectively. Thus, based on the values of these input signals, any of these logic circuits may conduct. For the sake of example, assume that the values of INPUTS$_{12}$ and INPUTS$_{16}$ are at levels such that logic circuits 12$_L$ and 16$_L$ conduct (i.e., at least one conductive path is formed), while assume further that the values of INPUTS$_{14}$ are at levels such that logic circuit 14$_L$ does not conduct. The operation of the three logic circuits under this assumption cause precharge nodes 12$_{PN}$ and 16$_{PN}$ to discharge to ground, while precharge node 14$_{PN}$ remains charged to V$_{DD}$. Thus, at t1, FIG. 2 illustrates a transition from high to low for precharge nodes 12$_{PN}$ and 16$_{PN}$, while no such transition is shown for precharge node 14$_{PN}$.

Shortly after t1, when the precharge nodes have had time to sufficiently discharge in response to the values of the INPUTS, if they are to discharge given those values, then up to one of the three select signals SEL1, SEL2, or SEL3 may be asserted. Recall that FIG. 2 is directed to an example of asserting SEL1. Thus, at a time t2 shortly after t1, SEL1 is shown to be asserted by transitioning from low to high. Note now the effect of this high signal. More particularly, recall that SEL$_{PN}$ has been precharged to V$_{DD}$. Therefore, when SEL1 is asserted, both the drain and gate of n-channel transistor T1 are high. However, at the same time, the level of D1, which is then low, is connected through inverters $12_{INV}$ and $INV_1$ to thereby present a low signal to the source of n-channel transistor T1. In other words, at this point, the gate-to-source voltage of n-channel transistor T1 is positive and is larger than the threshold voltage for n-channel transistor T1 and, therefore, n-channel transistor T1 conducts. Since transistor T1 conducts, the precharged voltage of $V_{DD}$ at precharge node $SEL_{PN}$ is discharged, as shown in FIG. 2 at t2. Moreover, this falling signal is inverted by inverter $INV_{OUT}$ and, thus, at the same time (or with some delay which is not shown) DATA OUTPUT concurrently transitions from low to high as shown in the bottom signal of FIG. 2. Thus, the transition at the DATA OUTPUT concludes the last action of the evaluate phase which represents the selection of D1 to the output of dynamic multiplexer 6.

Lastly, note that the last transition of FIG. 2 is shown at t3, and here the CLOCK signal returns from high to low. Accordingly, one skilled in the art will appreciate that once again the precharge phase of operation has commenced, and thus steps such as following from t0 forward may once again occur to once again select one or none of the data signals, D1, D2, or D3, during the evaluate phase to occur in response to the next transition of the CLOCK cycle.

FIG. 3 illustrates a timing diagram of an operational example of dynamic multiplexer 6 in a similar manner to that of FIG. 2, but in FIG. 3 the value of D2 is selected rather than the value of D1. Otherwise, the examples remain the same and, therefore, it is assumed that D1 and D3 are true as realized by logic circuits $12_L$ and $16_L$, respectively, while the value of D2 is false as realized by logic circuit $14_L$. Thus, from t0 to t1, the signals are the same as shown above in connection with FIG. 2 and the reader is referred above for additional details. The following discussion, therefore, focuses on the effect starting at t1 given the selection of D2 for output by data selection circuitry 10.

Looking to t1 in FIG. 3, the fifth signal from the top shows that SEL2 is asserted shortly after t1 (again, having given the precharge nodes time to discharge if they are to do so given the values of the INPUTS to logic circuits $12_L$, $14_L$, and $16_L$). Since only up to one select signal may be asserted for an evaluate phase of operation, then it is assumed although not shown that neither SEL1 nor SEL3 is asserted at t1. Returning to FIG. 1 to examine the effect of asserting SEL2 at t1, recall that precharge node $SEL_{PN}$ has been precharged to $V_{DD}$. Therefore, when SEL2 is asserted, both he drain and gate of T2 are high. Moreover, at the same time, the level of D2, which is then also high, is connected by inverter $INV_2$ to the source of n-channel transistor T2. In other words, at this point, both the gate-to-drain voltage and the gate-to-source voltage of n-channel transistor T2 is less than the threshold voltage for transistor T2; therefore, transistor T2 does not conduct. Since transistor T2 does not conduct, the precharged voltage of $V_{DD}$ at precharge node $SEL_{PN}$ is unaffected, as shown in FIG. 3. Consequently, this constant high signal remains inverted by inverter $INV_{OUT}$ and, thus, continuing after t2 DATA OUTPUT remains low as shown in the bottom signal of FIG. 3. Thus, the assertion of select signal SEL2 and the lack of a transition at the DATA OUTPUT concludes the last action of the evaluate phase which represents the selection of D2 to the output of dynamic multiplexer 6.

Given the above, recall from the earlier Background Of The Invention section of this document that numerous drawbacks exist in the prior art. These drawbacks are perhaps better appreciated having now detailed in FIGS. 1 through 3 the structure and operation of the prior art dynamic multiplexer. Specifically, it was discussed earlier that the prior art configuration includes a total of four signal inversions of data. These four inversions may now be seen given an understanding of FIG. 1. As an example, consider the situation of FIG. 2, where D1 is enabled and is selected for connection to the DATA OUTPUT. Initially, at least one positive transitioning signal must be input to logic circuit $12_L$. Note that this signal is sometimes referred to in the art as a monotonic rising signal, meaning is it low during the precharge phase and then rises high during the evaluate phase if the signal is to be considered asserted. The four inversions are then as follows. First, in response to the rising transition in the INPUT, and assuming logic circuit $12_L$ fully conducts (i.e., assuming that if there are other input signals they also combine to form a conductive path through logic circuit $12_L$), there is a falling transition of the voltage at precharge node $12_{PN}$ thereby representing a first inversion of the INPUT. Second, the falling transition of the voltage at precharge node $12_{PN}$ is inverted by inverter $12_{INV}$ to provide a rising transition, thereby representing a second inversion of the INPUT. Third, the rising transition from inverter $12_{INV}$ is inverted by inverter $INV_1$ to provide a falling transition, thereby representing a third inversion of the INPUT. Fourth, the falling transition from inverter $INV_1$ causes the discharge of precharge node $SEL_{PN}$ which is then inverted by inverter $INV_{OUT}$ to provide a rising transition, thereby representing a fourth inversion of the INPUT. Given these four inversions, there arises the problems as discussed earlier as well as additional complexities as will be appreciated by one skilled in the art. In contrast, below are presented inventive embodiments which improve upon these drawbacks while providing a dynamic multiplexer functionality.

Figure 4:
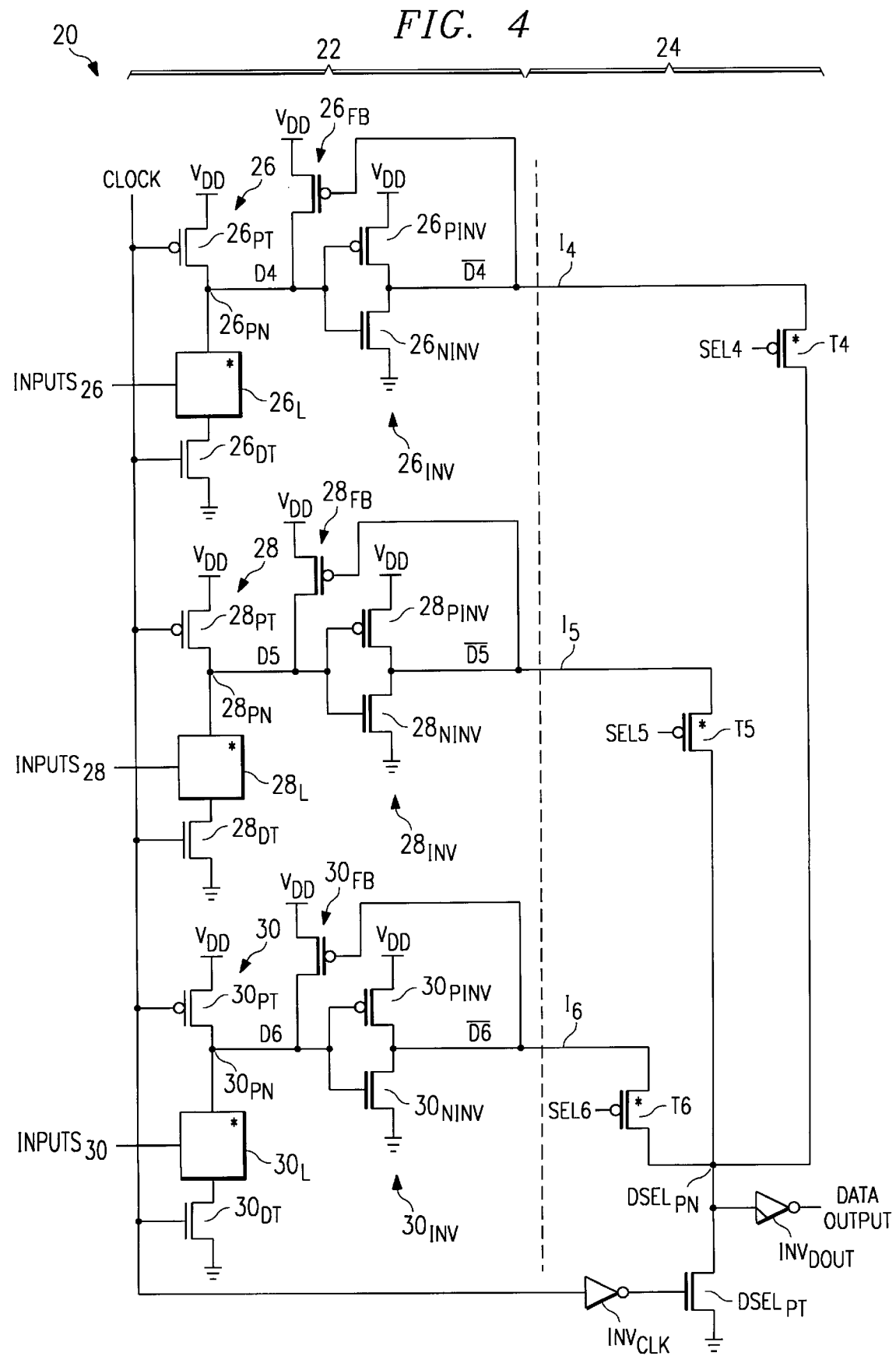
FIG. 4 illustrates a schematic of a dynamic multiplexer in accordance with the preferred embodiment.

FIG. 4 illustrates a schematic of a preferred embodiment of a dynamic multiplexer designated generally at 20 and in accordance with the present inventive scope. Dynamic multiplexer 20 includes data providing circuitry 22 for providing data signals and data selection circuitry 24 for then selecting one of the data signals. As with FIG. 1, therefore, a vertical dashed line generally separates data generating circuitry 22 from data selection circuitry 24 with the former to the left of the dashed line and the latter to the right of the line. Each of these circuits is discussed below.

Data generating circuitry 22 is the same as the prior art data generating circuitry shown in FIG. 1, above. Thus, data generating circuitry 22 includes three separate dynamic logic circuits. However, to facilitate a discussion later of dynamic multiplexer 20 as a whole, new reference numerals are used to discuss the preferred embodiment of FIG. 4. Accordingly, the three dynamic logic circuits of data generating circuitry 22 are labeled 26, 28, and 30. Note that data generating circuitry 22 may include any number of dynamic logic circuits and, therefore, three circuits 26, 28, and 30, are shown in FIG. 4 only by way of example. Given that circuits 26, 28, and 30 are the same as circuits 12, 14, and 16, above, the reader is invited to review the earlier discussion for details which also apply to circuits 26, 28, and 30, while only some of those details are restated below. Also, once again each of circuits 26, 28, and 30 shares various common attributes. Looking to circuit 26 by way of example, it is a known domino logic circuit stage, which includes a precharge transistor $26_{PT}$, a precharge node $26_{PN}$, an output inverter $26_{INV}$, and a discharge path including both a logic circuit $26_L$ and a discharge transistor $26_{DT}$. Additionally, dynamic multiplexer 20 includes a conductor for providing a CLOCK signal, and the CLOCK signal is connected to the gate of precharge transistor $26_{PT}$ and to the gate of discharge transistor $26_{DT}$.

Looking more specifically to the connections of circuit 26, in the preferred embodiment precharge transistor $26_{PT}$ is a p-channel transistor which is typically smaller than the n-channel transistors shown in FIG. 4. As discussed later, however, the conductivity type of certain transistors in FIG. 4 may be reversed within the inventive scope. Staying with the current illustration of FIG. 4, precharge transistor $26_{PT}$ has a source connected to a source of the system voltage level (e.g., $V_{DD}$) and a drain connected to precharge node $26_{PN}$. As noted above, the CLOCK signal is connected to the gate of precharge transistor $26_{PT}$ and is also connected to the gate of discharge transistor $26_{DT}$. Discharge transistor $26_{DT}$ is an n-channel having its source connected to a low reference voltage (e.g., ground) and its drain connected to a node $26_N$. Between precharge node $26_{PN}$ and node $26_N$ is connected logic circuit $26_L$. The particular logic of logic circuit $26_L$ may implement any type of logic equation. For example, often logic circuit $26_L$ will include numerous transistors connected in various fashions to implement such a logic equation, and the logic function is determined based on the particular transistor configuration as well as the respective input signals connected to the gates of those transistors. For purposes of the present discussion, the particular logic equation and inputs are not important and, thus, the legend INPUTS$_{26}$ is generally shown with it understood that such signals may come from any of various other circuits, being static, dynamic, or both. Indeed, note further that if it is known that INPUTS$_{26}$ will be disabling during the precharge phase of operation (i.e., and therefore logic circuit $26_L$ will not conduct during that time), then discharge transistor $26_{DT}$ may be eliminated from circuit 26. In any event, once the logic equation formed by logic circuit $26_L$ is true, at least one conductive path is formed through logic circuit $26_L$ connecting precharge node $26_{PN}$ to node $26_N$. Further, recall that the CLOCK signal is connected to the gate of discharge transistor $26_{DT}$, which has its drain also connected to node $26_N$. Thus, when the CLOCK is high then discharge transistor $26_{DT}$ is also conducting; if this conduction occurs while the logic equation implemented by logic circuit $26_L$ is true, then the conducting series path along the source/drains of the transistors forms a discharge path from precharge node $26_{PN}$ to ground such that the precharge voltage (i.e., $V_{DD}$) at precharge node $26_{PN}$ is permitted to discharge to ground. Alternatively, if discharge transistor $26_{DT}$ is eliminated as suggested above in the case where the INPUTS$_{26}$ are known to be non-enabling during the precharge phase of operation, note also that once those INPUTS$_{26}$ become enabling, and provided the logic equation formed by logic circuit $26_L$ is true, then a conductive path is formed through logic circuit $26_L$ and connects precharge node $26_{PN}$ directly to ground, thereby discharging the precharge voltage of $V_{DD}$ at precharge node $26_{PN}$.

Returning to precharge node $26_{PN}$, it is further connected to the input of output inverter $26_{INV}$. For purposes of noting additional aspects of the preferred embodiment, note that FIG. 4, unlike FIG. 1, illustrates specific details about this output inverter $26_{INV}$ (in contrast to inverter $12_{INV}$ which is only generally shown in FIG. 1). Specifically, inverter $26_{INV}$ is constructed in a known fashion and, therefore, includes a p-channel transistor $26_{PINV}$ and an n-channel transistor $26_{NINV}$. More specifically, the source of p-channel transistor $26_{PINV}$ is connected to $V_{DD}$ while its drain is connected to drain of n-channel transistor $26_{NINV}$. These connected drains form the output of inverter $26_{INV}$. The gates of p-channel transistor $26_{PINV}$ and an n-channel transistor $26_{NINV}$ are connected to one another and therefore provide the input to inverter $26_{INV}$. Lastly, the source of n-channel transistor $26_{NINV}$ is connected to ground. Given the configuration of inverter $26_{INV}$, one skilled in the art will appreciate that a low input enables p-channel transistor $26_{PINV}$ and thereby causes a high output, while a high input enables n-channel transistor $26_{NINV}$ and thereby causes a low output.

Lastly with respect to precharge node $26_{PN}$, note that it is further connected to a p-channel feedback transistor $26_{FB}$ from the output of inverted $26_{INV}$. Specifically addressing the connections of p-channel feedback transistor $26_{FB}$, its gate is connected to the output of inverter $26_{INV}$, its source is connected to $V_{DD}$, and its drain is connected to the input of inverter $26_{INV}$. Once again, therefore, one skilled in the art will therefore appreciate that once the precharge voltage is no longer connected to precharge node $26_{PN}$, feedback p-channel transistor $26_{FB}$ will maintain a high signal at the input of inverter $26_{INV}$ so long as precharge node $26_{PN}$ is not discharged by its corresponding discharge path.

With respect to circuits 28 and 30, note that their circuit elements are generally connected in the same manner as circuit 26 detailed above, with the exception of the inputs to, and the transistor configurations of, logic circuit $28_L$ and $30_L$, as well as the output of inverters $28_{INV}$ and $30_{INV}$ as detailed later. Thus, the inputs and outputs are discussed below while the remainder of the circuit details are not re-stated here and the reader is referred to the above discussion of circuit 26 for comparable details.

From the above, one skilled in the art will appreciate that the three dynamic logic circuits of data providing circuitry 22 to the left of the vertical dashed line in FIG. 4 present a total of three data signals. To distinguish these signals from those discussed in connection with the prior art in FIGS. 1 through 3, FIG. 4 (and FIGS. 5 and 6 discussed later) identify these three data signals as D4, D5 and D6, corresponding to circuits 26, 28, and 30, respectively. Each of these data signals D4, D5 and D6 passes through a corresponding inverter to provide complementary signals $\overline{D4}$, $\overline{D5}$ and $\overline{D6}$, to data selection circuitry 24 to the right of the dashed line in FIG. 4.

Turning then to data selection circuitry 24, it includes data inputs $I_4$, $I_5$, and $I_6$ for receiving each of the complementary data signals $\overline{D4}$, $\overline{D5}$ and $\overline{D6}$, respectively. Unlike the prior art, each data input $I_4$, $I_5$, and $I_6$ is not connected to an input of an inverter (e.g., see inverters INV$_1$, INV$_1$, and INV$_3$, of FIG. 1). Instead, and importantly for reasons discussed later, note that each data input $I_4$, $I_5$, and $I_6$ is connected directly to the source of a respective p-channel transistor T4, T5 and T6. The gates of p-channel transistors T4, T5 and T6 are connected to corresponding select signals, designated SEL4, SEL5, and SEL6, respectively. Lastly with respect to transistors T4, T5 and 16, their sources are connected to a precharge node DSEL$_{PN}$. Precharge node DSEL$_{PN}$ is connected to the drain of an n-channel precharge transistor DSEL$_{PN}$, which has its gate connected to the output of an inverter INV$_{CLK}$, where the input of that inverter receives the CLOCK signal. Also, the source of precharge transistor DSEL$_{PT}$ is connected to ground. Precharge node DSEL$_{PN}$ is also connected to the input of an inverter INV$_{DOUT}$, which provides the DATA OUTPUT for dynamic multiplexer 20. Lastly, note that INV$_{DOUT}$, in opposite fashion to various inverters discussed above, has a short diagonal line in the lower half of the inverter symbol; here, this indicates that inverter INV$_{DOUT}$ has an n-channel transistor (not expressly illustrated) connected in a feedback manner from the output of the inverter to its input. With respect to the n-channel feedback transistor, its gate is connected to the output of the corresponding inverter, the source of the feedback n-channel transistor is connected to ground, and the drain of the feedback n-channel transistor is connected to the input of the corresponding inverter. One skilled in the art will therefore appreciate that once the precharge voltage of ground (as discussed below) is no longer connected to precharge node $DSEL_{PN}$ by precharge transistor $DSEL_{PT}$ (e.g;., during the evaluate phase described below), the feedback n-channel transistor will maintain a low signal at the input of inverter $INV_{DOUT}$ so long as the precharge node is not discharged to high by its corresponding discharge path.

FIG. 5 illustrates a timing diagram of the operation of dynamic multiplexer 20 of FIG. 4, with a particular example where D4 is selected as the data for the DATA OUTPUT. Before proceeding, as with the earlier timing diagrams note for purposes of simplification that various delays are not shown in FIG. 5 when in actuality the transitions therein are not instantaneous and also note that certain transitions are triggered by other transitions rather than occurring at the immediate same time as shown. Looking then to FIG. 5 and starting at its top, the first signal is the CLOCK signal as connected to various precharge and discharge transistors in dynamic multiplexer 20. Following the CLOCK signal, the next three signals illustrate the voltage levels at precharge nodes $26_{PN}$, $28_{PN}$, and $30_{PN}$, respectively. Again, because the voltage on these nodes is defined earlier as representing data to be provided during the evaluate phase, then these signals are labeled with both the identifier of the precharge node and the corresponding data signal (e.g., $26_{PN}$/D4 indicates the voltage on precharge node $26_{PN}$, which corresponds to the data signal D4). The fifth signal in FIG. 5 shows the voltages at precharge node $DSEL_{PN}$ of data selection circuitry 24. The sixth signal in FIG. 5 shows the assertion a select signal to choose D4 since that is the example assumed to occur for FIG. 5; thus, this sixth signal shows the value of SEL4 which, as appreciated from the connections of FIG. 4 and the following discussion, is the select signal which is asserted to cause the value of D4 to be connected to the DATA OUTPUT. The seventh and final signal of FIG. 5 shows the value of the DATA OUTPUT.

At t0, the CLOCK signal is low. Therefore, the four precharge transistors in FIG. 5, namely, $26_{PT}$, $28_{PT}$, $30_{PT}$, and $DSEL_{PT}$, are enabled. The conduction of the first three of these four transistors causes each of the corresponding precharge nodes, $26_{PN}$, $28_{PN}$, and $30_{PN}$ to charge to a high voltage (i.e., to $V_{DD}$). In contrast to the prior art, however, note that that the conduction of precharge transistor $DSEL_{PT}$ causes its corresponding precharge node, $DSEL_{PN}$, to precharge to a low voltage (i.e., to ground) rather than to a high voltage (e.g., $V_{DD}$). In this regard, note that the term "precharge" is not intended to suggest a non-zero potential, but instead is to indicate a potential, be it positive, negative, or zero, which is brought upon a node during a precharge phase of operation. Thus, the CLOCK signal and the resulting potential at each given precharge node actually defines the precharge phase of operation in the embodiment of FIG. 4, and this phase occurs when the CLOCK signal is low. Given the above, this phase precharges nodes $26_{PN}$, $28_{PN}$, and $30_{PN}$ to $V_{DD}$ and further precharges nodes $DSEL_{PN}$ to ground. In the preferred embodiment, data selection circuitry 22 may rot be enabled to make any selection during the precharge phase of operation. Therefore, at t0 (i.e., during precharge), all select signals (i.e., SEL4 through SEL6) are not enabling. Because FIG. 5 pertains only to the selection of D4, only SEL4 is shown; moreover, since the selection signals are non-enabling during precharge, then at t0 select signal SEL4 is shown high which is non-enabling to p-channel transistor T4.

At t1, the CLOCK signal transitions from low to high. Therefore, the three precharge transistors of data providing circuitry 22, namely, transistors $26_{PT}$, $28_{PT}$, and $30_{PT}$ are disabled. Additionally, this CLOCK transition is inverted by inverter $INV_{CLK}$ and thereby also provides a disabling low signal to precharge transistor $DSEL_{PT}$ of data selection circuitry 24. Still further, the high CLOCK signal enables each of the discharge transistors of data providing circuitry 22, namely, transistors $26_{DT}$, $28_{DT}$, and $30_{DT}$, and also at this time the inputs signals $INPUTS_{26}$, $INPUTS_{28}$, and $INPUTS_{30}$ are asserted to each of logic circuits $26_L$, $28_L$, and $30_L$, respectively. Thus based on the values of these input signals, any of these logic circuits may conduct. For the sake of example, assume that the values of $INPUTS_{26}$ and $INPUTS_{30}$ are at levels such that logic circuits $26_L$ and $30_L$ conduct, while assume further that the values of $INPUTS_{28}$ are at levels such that logic circuit $28_L$ does not conduct. The operation of the three logic circuits under this assumption causes precharge nodes $26_{PN}$ and $30_{PN}$ to discharge to ground, while precharge node $28_{PN}$ remains charged to $V_{DD}$. Thus, at t1, FIG. 5 illustrates a transition from high to low for precharge nodes $26_{PN}$ and $30_{PN}$, while no such transition is shown for precharge node $28_{PN}$.

Shortly after t1, when the precharge nodes have had time to sufficiently discharge in response to the values of the INPUTS, if they are to discharge given those values, then up to one of the three select signals SEL4, SEL5, or SEL6 may be asserted. Recall that FIG. 5 is directed to an example of asserting SEL4. Thus, at a time t2 shortly after t1, SEL4 is shown to be asserted by transitioning from high to low. Note that SEL4 is an active low signal, meaning it is "asserted" by presenting it low because it is coupled to the gate of a p-channel transistor; thus, note now the effect of this asserted low signal. Particularly, recall that precharge node $DSEL_{PN}$ has been precharged to ground. Therefore, when SEL4 is asserted low, both the drain and gate of p-channel transistor T4 are low. However, at the same time, the level of D4, which is then low, is inverted by inverter $26_{INV}$ and therefore a high signal is connected to the source of p-channel transistor T4. In other words, at this point, the gate-to-source voltage of p-channel transistor T4 is negative, and its absolute value is larger than the absolute value of the negative threshold voltage for p-channel transistor T4; therefore, p-channel transistor T4 conducts. Since p-channel transistor T4 conducts, the precharged voltage of ground at precharge node $DSEL_{PN}$ is discharged to $V_{DD}$, as shown in FIG. 5 at t2. In this regard, note that the term "discharge" is not intended to suggest a resulting zero potential, but instead is to indicate a potential, be it positive, negative, or zero, which may be brought upon a node during an evaluate phase of operation so as to change the potential at that node as compared to its potential resulting from the precharge phase of operation. In any event, given the discharge to a voltage of $V_{DD}$, this rising signal is inverted by inverter $INV_{DOUT}$ and, thus, at the same time (or with some delay which is not shown) DATA OUTPUT concurrently transitions from high to low as shown in the bottom signal of FIG. 5. Thus, the transition at the DATA OUTPUT concludes the last action of the evaluate phase which represents the selection of D4 to the output of dynamic multiplexer 20.

FIG. 6 illustrates a timing diagram of an operational example of dynamic multiplexer 20 in a similar manner to that of FIG. 5, but in FIG. 6 the value of D5 is selected rather than the value of D4. Otherwise, the examples remain the same and, therefore, it is assumed that D4 and D6 are true as realized by logic circuits $26_L$ and $30_L$, respectively, while the value of D5 is false as realized by logic circuit $28_L$. Thus, from t0 to t1, the signals are the same as shown above in connection with FIG. 5 and the reader is referred above for additional details. The following discussion, therefore, focuses on the effect starting at t1 given the selection of D5 for output by data selection circuitry 24.

Looking to t1 in FIG. 6, the fifth signal from the top shows that select signal SEL5 is asserted active low at t2, again, having given precharge nodes $26_{PN}$, $28_{PN}$, and $30_{PN}$, time to discharge if they are to do so given the values of the INPUTS to logic circuits $26_L$, $28_L$, and $30_L$, respectively. Since only up to one select signal SEL4 through SEL6 may be asserted for an evaluate phase of operation, then it is assumed although not shown that neither SEL4 nor SEL6 is asserted at t1. Returning to FIG. 4 to examine the effect of asserting SEL5 low at t2, recall that precharge node $DSEL_{PN}$ has been precharged to ground. Therefore, when SEL5 is asserted low, both the drain and gate of transistor T5 are low. Moreover, at the same time, the level of D5, which is then also high, is inverted by inverter $28_{INV}$ and thus a low level is connected to the source of p-channel transistor T5. In other words, at this point, both the gate-to-drain voltage and the gate-to-source voltage of p-channel transistor T5 are zero, and therefore are not negative as is required to cause the p-channel transistor T5 to conduct. Since p-channel transistor T5 does not conduct, the precharged voltage of ground at precharge node $DSEL_{PN}$ is unaffected, as shown in FIG. 5. Consequently, this constant low signal remains inverted by inverter $INV_{DOUT}$ and, thus, continuing after t2 DATA OUTPUT remains high as shown in the bottom signal of FIG. 6. Thus, the assertion of the SEL5 signal and the lack of a transition at the DATA OUTPUT concludes the last action of the evaluate phase which represents the selection of D5 to the output of dynamic multiplexer 20.

Given the above, note now various attributes of dynamic multiplexer 20 and its contrast to the earlier-described prior art of FIGS. 1 through 3. Specifically, note that dynamic multiplexer 20 only gives rise to a total of three signal inversions to produce its output whereas, as shown above, the prior art requires four signal inversions. The three inversions of the preferred embodiment may now be seen given an understanding of FIG. 4. As an example, consider the situation of FIG. 5 where D4 is enabled and is selected for connection to the DATA OUTPUT. Initially, at least one positive transitioning signal must be input to logic circuit $26_L$. Recall that this signal is referred to in the art as a monotonic rising signal. The three inversions of the preferred embodiment are then as follows. First, in response to the transition in the INPUT, and assuming logic circuit $26_L$ fully conducts (i.e., assuming that if there are other input signals they also combine to form a conductive path through logic circuit $12_L$), there is a falling transition of the voltage at precharge node $26_{PN}$ thereby representing a first inversion of the INPUT. Second, the falling transition of the voltage at precharge node $26_{PN}$ is inverted by inverter $26_{INV}$ to provide a rising transition, thereby representing a second inversion of the INPUT. Importantly, however, note that this rising transition provides a monotonic rising signal which may be used to directly drive the source of p-channel transistor T4; thus, unlike the prior art, an additional inversion is not inserted at this point. Thus, as the third and final inversion of the signal, the rising transition from inverter $26_{INV}$ causes the discharge of precharge node $DSEL_{PN}$ to $V_{DD}$, which is then inverted by inverter $INV_{DOUT}$ to provide a rising transition, thereby representing a third inversion of the INPUT. Given these three inversions, note that they represent a twenty-five percent reduction in the drawbacks of the prior art as described above. For example, there is a reduction in the need to include additional circuitry, and a reduction in the delay and cost of such circuitry. As another example, there is less space required on the semiconductor device used to form dynamic multiplexer 20. Still other advantages will be appreciated by one skilled in the art.

As another consideration of the present embodiment note also that certain prior art considerations actually teach away from the approach of the preferred embodiment. More specifically, it is generally urged in the design of dynamic logic stages that it is undesirable to have series-connections of p-channel transistors, that is, to have the source/drain of one p-channel transistor connected directly to the source/drain of another p-channel transistor. This principle is typically thought to provide better speed performance, or to reduce the size required to construct p-channel transistors. However, note in the preferred embodiment that each connection between a circuit in data providing circuitry 22 and a corresponding circuit in data selection circuitry 24 gives rise to such a series connection of p-channel transistor transistors. For example, recall that inverter $26_{INV}$ was earlier detailed, and it was explained that later the purposes for such detail would be explored. It as at the current point that such an illustration is helpful. More particularly, looking to the connection between circuit 26 and the corresponding circuit in data selection circuitry 24, note that the source/drain of p-channel transistor $26_{PINV}$ from inverter $26_{INV}$ is connected directly to the source/ drain of p-channel transistor T4. Thus, against the teaching of the prior art, there is a direct series connection between the source/drains of two p-channel transistor transistors. However, the present inventor has recognized that such an approach is desirable and beneficial in that it provides the reduced signal inversions described above, and therefore the generally accepted directive against such an approach, as discussed above, is outweighed by the advantages provided by the preferred embodiment.

To provide an alternative embodiment consistent with the present inventive scope, recall it was earlier noted that the conductivity type of various transistors in FIG. 4 may be reversed. Given the detailed operational discussion provided for FIGS. 5 and 6, this aspect may now be better developed and is illustrated in FIG. 7 which depicts an alternative dynamic multiplexer designated generally at 40, and once again having a vertical dashed line separating data providing circuitry 22a to the left of the line from data selection circuitry 24a to the right of the line. In dynamic multiplexer 40, note that the three inversion benefit described above with respect to FIGS. 4 through 6 is once again achieved, but here the conductivity type of each precharge transistor and transistor in the discharge path for all of the dynamic logic paths is changed in contrast to the comparable transistors in FIG. 4. For sake of comparison each of the reference numerals from FIG. 4 are carried forward into FIG. 7 where no change is made to the component, and where an alternative is created by changing the conductivity type of a transistor, the letter "a" is added to the reference numeral as used in FIG. 4. For example, the conductivity type of the transistors in circuits 26, 28, and 30 of FIG. 4 are changed in FIG. 7. As a particular example, circuit 26a includes an n-channel transistor precharge transistor $26a_{PT}$, a p-channel transistor discharge transistor $26a_{DT}$, a logic circuit $26a_L$ which is understood to include one or more transistors of the same conductivity type as the discharge transistor $26a_{DT}$ (i.e., p-channel conductivity type), and an n-channel transistor feedback transistor $26a_{FB}$. The remaining examples for data providing circuitry 22a will be ascertainable by one skilled in the art. Similarly, changes are made to the conductivity types of the precharge transistor and the transistors in the discharge paths of data selection circuitry 24, again adding the letter "a" to demonstrate the alternative in contrast to FIG. 4. For example, the precharge transistor of data selection circuitry 24a is a p-channel transistor DSELa$_{PT}$. As another example, the three transistors in the three discharge paths of data selection circuitry 24a are n-channel transistors T4a, T5a, and T6a. Given the change in conductivity types for dynamic multiplexer 40, one skilled in the art will also appreciate that the precharge and discharge voltages are reversed in FIG. 7. In other words, with respect to circuits 26a, 28a, and 30a, the corresponding precharge nodes 26a$_{PN}$, 28a$_{FN}$, and 30a$_{PN}$, respectively, are connected to precharge to ground, and with respect to data selection circuitry 24a, its precharge node DSELa$_{PN}$ is connected to precharge to V$_{DD}$.

Given the above, the operation of dynamic multiplexer 40 may be derived from the comparable operation of dynamic multiplexer 20 of FIG. 4 and, therefore, need not be detailed to the level as shown in FIGS. 5 and 6. Instead, one skilled in the art will appreciate that a discharge in any of circuits 26a, 28a, and 30a causes a precharge node to rise from ground to V$_{DD}$, and a discharge of precharge node DSELa$_{PD}$ causes that node to fall from V$_{DD}$ to ground. Given these connections, note again that only three inversions are incurred by a data signal passing from any of circuits 26a, 28a, and 30a and then selected to the output of data selection circuitry 24a. This again occurs because any of circuits 26a, 28a, and 30a provides two inversions of the signal as output by a corresponding inverter 26$_{INV}$, 28$_{INV}$, or 30$_{INV}$, but the resulting signal at that point is already configured to provide the correct monotonic transition (i.e., a falling transition in this embodiment) for the source of any of n-channel transistors T4a, T5a, or T6a. Thus, there is no requirement of an additional transition prior to connecting to the source of such a transistor, as was present in the prior art.

As yet another aspect of the present embodiments, and looking to both FIGS. 4 and 7, note another consideration with respect to transistor threshold voltages, as indicated in that some of the transistors of those Figures have an asterisk located by the corresponding transistor symbol while other transistors in those Figures do not. In this regard and looking by way of example to FIG. 4, consider the following. With respect to data providing circuitry 22, note that an asterisk is placed by each of logic circuits 26$_L$, 28$_L$, and 30$_L$ to thereby apply to all of the n-channel transistors of these circuits. Conversely, note that no such designation is placed by each of the corresponding discharge transistors (i.e., 26$_{DT}$, 28$_{DT}$, and 30$_{DT}$). With respect to data selection circuitry 24, each of discharge transistors T1, T2 and T3 is marked with an asterisk.

Regarding the meaning of the asterisk, note that in the preferred embodiment the threshold voltage ("V$_T$") of each of these asterisk-marked transistors is lower than that of the like conductivity type transistors in the circuit which are not designated with an asterisk. For example, the V$_T$ of p-channel transistors T1, T2, and T3 is lower than the V$_T$ of n-channel transistor 26$_{PINV}$. Before detailing the significance of the use of a low threshold voltage transistor versus a high threshold voltage transistor, note that these terms are used to designate the relative values of one transistor's threshold voltage versus another like-conductivity transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following for transistors of like conductivity types. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this discussion, a transistor of the first type will be referred to as an HVT transistor (i.e., a transistor with a relatively high V$_T$) while a transistor of the second type will be referred to as an LVT transistor (i.e., a transistor with a relatively low V$_T$). Further, note that an HVT transistor preferably has a V$_T$ on the order of that for transistors which are now used throughout a circuit where all transistors share the same V$_T$, and where that V$_T$ was determined to be high enough to avoid unacceptably large leakage currents. Note also that although an LVT transistor provides the benefit of a higher drive current as opposed to an HVT transistor, in contrast it gives rise to the detriment that it provides a greater leakage current (i.e., when not conducting) than an HVT transistor. Indeed, the typical leaking by an LVT transistor may be greater than that of an HVT transistor by two or three orders of magnitude or more. Lastly, note that the transistor V$_T$ considerations just described as well as additional results from those considerations as detailed below are further explored in U.S. patent application Ser. No. 08/687,800 (Attorney Docket TI-22618), entitled "Dynamic Logic Circuits Using Transistors Having Differing Threshold Voltages", having the same inventor as the current application, and filed Jul. 19,1996, and which is hereby incorporated herein by reference.

Turning now to the effects of including different V$_T$ transistors in the same circuit, the benefits of the mixing of differing threshold voltages may be realized by once again examining the operation of dynamic multiplexer 20, but by now looking more specifically to the effects on that operation due to the differing threshold voltages. Thus, once again the following discussion first involves the precharge phase of operation and then discusses the evaluate phase of operation.

During the precharge phase of operation (i.e., when the CLOCK signal is low in the example of FIG. 4), consider first the transistors in circuit 26. Specifically, discharge transistor 26$_{DT}$ is off while p-channel precharge transistor 26$_{PT}$ causes precharge node 26$_{PN}$ to charge toward a precharge voltage of V$_{DD}$. Depending on the values of INPUTS$_{26}$, the remaining n-channel transistors of logic circuit 26$_L$ may be on or off. Regardless of those transistors, however, note that discharge cannot occur from precharge node 26$_{PN}$ to ground because discharge transistor 26$_{DT}$ is off. Note further that discharge transistor 26$_{DT}$ is an HVT transistor (it is not marked with an asterisk). As a result, because an HVT transistor has a lower leakage current when off (as opposed to an LVT transistor), then the HVT n-channel discharge transistor 26$_{DT}$ provides a limit to how much current can leak from precharge node 26$_{PN}$, through its corresponding discharge path, to ground. Consequently, even though the discharge path contains some LVT transistors (i.e., the n-channel transistors connected between precharge node 26$_{PN}$ and ground other than transistor 26$_{DT}$), the amount of possible leakage current is limited by the HVT n-channel discharge transistor 26$_{DT}$ during the precharge phase of operation. Note that the same principle also applies to circuits 28 and 30 as well. Still further, with respect to p-channel transistors, a similar result also occurs. For example, consider the path from precharge node $DSEL_{PN}$ to p-channel transistor $26_{PINV}$ of inverter $26_{INV}$. During the precharge phase of operation, it is known that p-channel transistor $26_{PINV}$ receives a non-enabling signal at its gate and, therefore, it does not conduct. Note further that p-channel transistor $26_{PINV}$ is an HVT transistor and, thus, it will limit current leakage to a lower level than would an LVT transistor of like conductivity type, such as any of transistors T1, T2, or T3. Thus, to the extent that there is leakage between precharge node $DSEL_{PN}$ which is precharged to ground and the source of p-channel transistor $26_{PINV}$ which is connected to $V_{DD}$, this leakage will be lower than if each of the p-channel transistors in this path were LVT transistors.

During the evaluate phase of operation (i.e., when the CLOCK signal is high in the example of FIG. 4), consider again the n-channel transistors in circuit 26. Now, transistor $26_{DT}$ is on as may be a series path through logic circuit $26_L$ (i.e., provided the value(s) of $INPUTS_{26}$ are sufficient to enable that path). In other words, recall that precharge node $26_{PN}$ at the end of the precharge phase represents a precharged logic state which, in the example of FIG. 4, is a logic high. However, once the evaluate phase begins, the combination of $INPUTS_{26}$ may cause all of the transistors, in combination with discharge transistor $26_{DT}$, to electrically connect precharge node $26_{PN}$ to ground. In response the charge at precharge node $26_{PN}$ discharges to ground and the output connected to the discharged precharge node rises from high to low. During this instance, the transistors making up the discharge path may be thought of as resistors. Note, therefore, since the transistors in logic circuit $26_L$ are LVT transistors, the resistance of those transistors is significantly less than the resistance of the HVT transistor $26_{DT}$. Since these two resistances are in series, the overall resistance of the discharge path is reduced as compared to a path which included all HVT transistors. Indeed, note this benefit could be accomplished by having only some of transistors in each path (if there are multiple paths) of logic circuit $26_L$ be an LVT transistor. However, by making all of them LVT transistors, the overall series resistance is still lower than if only one were an LVT transistor while the other(s) were an HVT transistor. In any event, because the overall series resistance is reduced, the time needed to discharge the circuit (and, therefore, change the logic state of the corresponding output) is reduced as well. Once again, note further that a similar result also occurs with respect to p-channel transistors. For example, consider once more the path from precharge node $DSEL_{PN}$ to p-channel transistor $26_{PINV}$ of inverter $26_{INV}$. During the evaluate phase of operation, if both p-channel transistor $26_{PINV}$ and transistor T3 are conducting, then a discharge path is formed such that precharge node $DSEL_{PN}$ may discharge from ground to $V_{DD}$. Once again, this path includes transistors of both LVT and HVT types. Thus, the overall resistance of this path is less than it would be if the path included only HVT transistors. Consequently, the discharge speed of the path is improved over a prior art approach of including all HVT transistors.

Given the above configuration, one skilled in the art will readily appreciate that the mixing of transistors with differing threshold voltages provides various benefits. During the precharge phase of operation, the benefit of an HVT transistor in the discharge path is realized in that leakage current is reduced over a circuit having only LVT transistors. Indeed, this leakage should approximate, or be the same as, the leakage of circuits which include only HVT transistors. In opposite fashion, during the evaluate phase of operation, the benefit of one or more LVT transistors in the discharge path is realized in that the speed at which the logic state of the circuit may transition is increased. Lastly, note further some of these benefits also may be achieved through the use of series-connected LVT transistors known to be non-enabled during the precharge phase of operation. For example, returning to circuit 26 of FIG. 4, assume that discharge transistor $26_{DT}$ is an LVT transistor, and assume further that one of the transistors in logic circuit $26_L$ is also an LVT transistor and has its gate connected to an input which is known to be non-enabling during the precharge phase of operation. Given these assumptions, during the precharge phase of operation it is further known that the CLOCK signal is non-enabling to discharge transistor $26_{DT}$; thus, both discharge transistor $26_{DT}$ (assumed to be LVT in the current example) and the LVT transistor in logic circuit $26_L$ are series connected, and are both off during the precharge phase. Consequently, the amount of leakage current which may pass through this path is less than what would pass if it were to include only a single non-enabled LVT transistor. For a more detailed discussion of the principles and concepts surrounding this aspect, the reader is referred to U.S. patent application Ser. No. 08/683,996 (Attorney Docket TI-23246), entitled "Dynanmic Logic Circuits Using Cascode Transistors Having Low Threshold Voltages", having the same inventor as the current application, and filed Jul. 19, 1996, and which is hereby incorporated herein by reference.

From the above, it may be appreciated that the above embodiments provide numerous advantages. For example, a dynamic multiplexer constructed according to the above inventive scope may be used in various different types of devices, including microprocessors, signal processors, and application specific integrated circuits. As another example, while the above FIGS. 4 and 7 illustrate the electrical connection of two different embodiments, they and are not intended to necessarily limit the physical placement of the schematic components of those embodiments. Thus, in one approach, each of the components of those Figures may be in relative close proximity to one another, while in an alternative approach some of the components may be relatively distant from one another. In this latter regard, by way of example, the components to the left side of the illustrated dashed line may be at one location on an integrated circuit while the components to the right side of the illustrated dashed line may be at a different and relatively remote location on an integrated circuit Indeed, note that the source input connection of the components to the right side of the dashed line provides greater noise immunity and, therefore such connections better withstand longer conductor distances and may thus give rise to distances between the components on both sides of the illustrated dashed line. As still another example, the present embodiments reduce costs associated with prior art configurations, and improve performance as well. Additional advantages have been set forth earlier, and as yet another advantage note that while the present embodiments have been described in detail, various substitutions, modifications or alterations could be made to the descriptions set forth above as demonstrated by the various earlier examples, and still additional considerations as ascertainable by one skilled in the art. Thus, these aspects and the described embodiments are all considered within the inventive scope, as defined by the following claims.

What is claimed is:

1. A dynamic multiplexer circuit, comprising:
   an integer number N of data providing circuits, wherein the integer number N is greater than one and wherein each of the plurality of data providing circuits comprises:

a precharge node to be precharged to a precharge voltage during a precharge phase;

a conditional series discharge path connected to the precharge node and operable in response to at least one enabling input signal to discharge the precharge voltage at the precharge node during an evaluate phase thereby providing a first monotonic transitioning data signal at the precharge node;

an inverter coupled to the precharge node and having an output for providing a second monotonic transitioning data signal, wherein the second monotonic transitioning data signal is complementary of the first monotonic transitioning data signal;

the integer number N of data select paths, wherein each of the data select paths comprises a select transistor, the select transistor having a source coupled to receive the second monotonic transitioning data signal and a gate connected to receive a select signal;

an output precharge node, wherein a drain of the select transistor in each of the data select paths is coupled to conditionally discharge the output precharge node;

an output inverter having an input connected to the output precharge node; and wherein in a given evaluate phase of operation, in response to assertion of a select signal corresponding to one of the data select paths, the select transistor receiving the asserted select signal at its gate and the second monotonic transitioning data signal at its source conducts for providing an output data signal at an output of the output inverter, wherein the output data signal represents three signal inversions of the at least one enabling input signal.

2. The dynamic multiplexer circuit of claim 1, wherein the conditional series discharge path of each of the integer number N of data providing circuits consists of n-channel transistors.

3. The dynamic multiplexer circuit of claim 2 wherein the select transistor of each of the integer number N of data select paths is a p-channel transistor.

4. The dynamic multiplexer circuit of claim 3 wherein the precharge voltage comprises a first precharge voltage, and further comprising an n-channel precharge transistor connected to the output precharge node for precharging the output precharge node to a second precharge voltage during the precharge phase, wherein the second precharge voltage is lower than the first precharge voltage.

5. The dynamic multiplexer circuit of claim 1, wherein the conditional series discharge path of each of the integer number N of data providing circuits consists of p-channel transistors.

6. The dynamic multiplexer circuit of claim 5 wherein the select transistor of each of the integer number N of data select paths is an n-channel transistor.

7. The dynamic multiplexer circuit of claim 6 wherein the precharge voltage comprises a first precharge voltage, and further comprising a p-channel precharge transistor connected to the output precharge node for precharging the output precharge node to a second precharge voltage during the precharge phase, wherein the second precharge voltage is higher than the first precharge voltage.

8. The dynamic multiplexer circuit of claim 1:

wherein the inverter for each of the integer number N of data providing circuits has an input and an output, and comprises:

a first p-channel transistor having a source connected to a first voltage potential, a gate connected to the input of the inverter, and a drain connected to the output of the inverter; and a first n-channel transistor having a source connected to a second voltage potential lower than the first voltage potential, a gate connected to the input of the inverter, and a drain connected to the output of the inverter.

9. The dynamic multiplexer circuit of claim 8:

wherein the first p-channel transistor has a first threshold voltage;

and wherein the select transistor of each of the integer number N of data select paths is a p-channel transistor having a second threshold voltage lower than the first threshold voltage.

10. The dynamic multiplexer circuit of claim 8:

wherein the first n-channel transistor has a first threshold voltage;

and wherein the select transistor of each of the integer number N of data select paths is an n-channel transistor having a second threshold voltage lower than the first threshold voltage.

11. The dynamic multiplexer circuit of claim 1 wherein the precharge voltage comprises a first precharge voltage, and further comprising a precharge transistor connected to the output precharge node for precharging the output precharge node to a second precharge voltage during the precharge phase, wherein the second precharge voltage is unequal to the first precharge voltage.

12. The dynamic multiplexer circuit of claim 1, wherein the conditional series discharge path of each of the integer number N of data providing circuits comprises:

a discharge transistor having its gate connected to receive a non-enabling signal during the precharge phase and an enabling signal during the evaluate phase; and at least one transistor having its source/drain connected in series with a source/drain of the discharge transistor.

13. The dynamic multiplexer circuit of claim 12:

wherein the discharge transistor has a first threshold voltage;

wherein the at least one transistor has a second threshold voltage; and wherein the second threshold voltage is lower than the first threshold voltage.

14. The dynamic multiplexer circuit of claim 12:

wherein the discharge transistor has a first threshold voltage;

wherein the at least one transistor has the first threshold voltage; and wherein the at least one transistor has its gate coupled to receive a non-enabling signal during the precharge phase.

15. A dynamic multiplexer circuit, comprising:

an integer number N of data providing circuits, wherein the integer number N is greater than one and wherein each of the plurality of data providing circuits comprises:

a precharge node to be precharged to a first precharge voltage during a precharge phase;

a conditional series discharge path connected to the precharge node and operable in response to at least one enabling input signal to discharge the first precharge voltage at the precharge node during an evaluate phase thereby providing a first monotonic transitioning data signal at the precharge node;

an inverter coupled to the precharge node and having an output for providing a second monotonic transitioning data signal, wherein the second monotonic transitioning data signal is complementary of the first monotonic transitioning data signal, wherein the inverter has an input and an output, and comprises:
- a first p-channel transistor having a source connected to a first voltage potential, a gate connected to the input of the inverter, and a drain connected to the output of the inverter; and
- a first n-channel transistor having a source connected to a second voltage potential lower than the first voltage potential, a gate connected to the input of the inverter, and a drain connected to the output of the inverter;
- the integer number N of data select paths, wherein each of the data select paths comprises a select transistor, the select transistor having a source coupled to receive the second monotonic transitioning data signal and a gate connected to receive a select signal;
- an output precharge node, wherein a drain of the select transistor in each of the data select paths is coupled to conditionally discharge the output precharge node;
- an output inverter having an input connected to the output precharge node;
- a precharge transistor connected to the output precharge node for precharging the output precharge node to a second precharge voltage during the precharge phase, wherein the second precharge voltage is unequal to the first precharge voltage; and
- wherein in a given evaluate phase of operation, in response to assertion of a select signal corresponding to one of the data select paths, the select transistor receiving the asserted select signal at its gate and the second monotonic transitioning data signal at its source conducts for providing an output data signal at an output of the output inverter, wherein the output data signal represents three signal inversions of the at least one enabling input signal.

16. The dynamic multiplexer circuit of claim 15:
wherein the first p-channel transistor has a first threshold voltage;
and wherein the select transistor of each of the integer number N of data select paths is a p-channel transistor having a second threshold voltage lower than the first threshold voltage.

17. The dynamic multiplexer circuit of claim 15:
wherein the first n-channel transistor has a first threshold voltage;
and wherein the select transistor of each of the integer number N of data select paths is an n-channel transistor having a second threshold voltage lower than the first threshold voltage.

18. The dynamic multiplexer circuit of claim 15, wherein the conditional series discharge path of each of the integer number N of data providing circuits comprises:
a discharge transistor having its gate connected to receive a non-enabling signal during the precharge phase and an enabling signal during the evaluate phase; and
at least one transistor having its source/drain connected in series with a source/drain of the discharge transistor.

19. The dynamic multiplexer circuit of claim 18:
wherein the discharge transistor has a first threshold voltage;
wherein the at least one transistor has a second threshold voltage; and
wherein the second threshold voltage is lower than the first threshold voltage.

20. The dynamic multiplexer circuit of claim 18:
wherein the discharge transistor has a first threshold voltage;
wherein the at least one transistor has the first threshold voltage; and
wherein the at least one transistor has its gate coupled to receive a non-enabling signal during the precharge phase.

21. The dynamic multiplexer circuit of claim 15:
wherein the first p-channel transistor has a first threshold voltage;
wherein the select transistor of each of the integer number N of data select paths is a p-channel transistor having a second threshold voltage lower than the first threshold voltage;
wherein the conditional series discharge path of each of the integer number N of data providing circuits comprises:
a discharge transistor having its gate connected to receive a non-enabling signal during the precharge phase and an enabling signal during the evaluate phase; and
at least one transistor having its source/drain connected in series with a source/drain of the discharge transistor.

22. The dynamic multiplexer circuit of claim 21:
wherein the discharge transistor has a third threshold voltage;
wherein the at least one transistor has a fourth threshold voltage; and
wherein the fourth threshold voltage is lower than the third threshold voltage.

23. The dynamic multiplexer circuit of claim 15:
wherein the first n-channel transistor has a first threshold voltage;
wherein the select transistor of each of the integer number N of data select paths is an n-channel transistor having a second threshold voltage lower than the first threshold voltage;
wherein the conditional series discharge path of each of the integer number N of data providing circuits comprises:
a discharge transistor having its gate connected to receive a non-enabling signal during the precharge phase and an enabling signal during the evaluate phase; and
at least one transistor having its source/drain connected in series with a source/drain of the discharge transistor.

24. The dynamic multiplexer circuit of claim 23:
wherein the discharge transistor has a third threshold voltage;
wherein the at least one transistor has a fourth threshold voltage; and
wherein the fourth threshold voltage is lower than the third threshold voltage.

25. A method of operating a dynamic multiplexer circuit, comprising the steps of:
for an integer number N of data providing circuits, wherein the integer number N is greater than one, the steps of:
precharging a precharge node to be precharged to a precharge voltage during a precharge phase;

conditionally discharging the precharge node by enabling a conditional series discharge path in response to at least one enabling signal, wherein the conditional series discharge path is connected to the precharge node and operable in response to the at least one enabling input signal to discharge the precharge voltage at the precharge node during an evaluate phase thereby providing a first monotonic transitioning data signal at the precharge node;

inverting the first monotonic transitioning data signal to provide a second monotonic transitioning data signal;

selecting for output a data signal represented by the second monotonic transitioning data signal from one of the data providing circuits, wherein the selecting step comprises:

coupling the data signal to a source of a select transistor, the select transistor having a gate connected to receive a select signal and a source coupled to receive the second monotonic transitioning data signal;

enabling the select signal to the select transistor during an evaluate phase of operation;

prior to the enabling step, precharging an output precharge node, wherein a drain of the select transistor is coupled to conditionally discharge the output precharge node; and responsive to the enabling step, providing an output data signal at an output of an output inverter having its input coupled to the output precharge node, wherein the output data signal represents three signal inversions of the at least one enabling input signal.

* * * * *